(12) United States Patent
Boek et al.

(10) Patent No.: US 8,147,976 B2
(45) Date of Patent: Apr. 3, 2012

(54) SEALED GLASS PACKAGE

(75) Inventors: Heather Debra Boek, Corning, NY (US); John W Botelho, Corning, NY (US); Jason Arthur Howles, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/172,015

(22) Filed: Jun. 29, 2011

(65) Prior Publication Data

US 2011/0256407 A1    Oct. 20, 2011

Related U.S. Application Data

(62) Division of application No. 12/156,377, filed on May 30, 2008, now Pat. No. 7,992,411.

(51) Int. Cl.
*B32B 17/00* (2006.01)
*E06B 3/00* (2006.01)
*H01J 1/62* (2006.01)

(52) U.S. Cl. .......... 428/432; 428/34; 428/433; 313/512; 501/15; 501/21; 501/152

(58) Field of Classification Search .......... 428/34, 428/432, 433; 313/512; 501/15, 21, 152
See application file for complete search history.

(56) References Cited

U.S. PATENT DOCUMENTS

| | | | | |
|---|---|---|---|---|
| 4,883,217 | A * | 11/1989 | Dunn et al. | 228/124.5 |
| 6,929,523 | B2 | 8/2005 | Ishii et al. | 445/23 |
| 6,998,776 | B2 | 2/2006 | Aitken et al. | 313/512 |
| 7,371,143 | B2 | 5/2008 | Becken et al. | 445/25 |
| 7,407,423 | B2 | 8/2008 | Aitken et al. | 445/25 |
| 2007/0090759 | A1 | 4/2007 | Choi et al. | 313/512 |
| 2007/0170850 | A1 | 7/2007 | Choi et al. | 313/506 |
| 2007/0170855 | A1 | 7/2007 | Choi et al. | 313/512 |
| 2007/0170860 | A1 | 7/2007 | Choi et al. | 313/512 |
| 2007/0247068 | A1 | 10/2007 | Park | 313/512 |

FOREIGN PATENT DOCUMENTS

| | | |
|---|---|---|
| EP | 1811570 | 7/2007 |
| EP | 1811571 | 7/2007 |
| EP | 1811587 | 7/2007 |
| EP | 1811588 | 7/2007 |
| EP | 1811589 | 7/2007 |
| EP | 1811590 | 7/2007 |
| EP | 1814179 | 8/2007 |
| EP | 1814180 | 8/2007 |
| EP | 1814186 | 8/2007 |

* cited by examiner

*Primary Examiner* — Donald J Loney
(74) *Attorney, Agent, or Firm* — Kevin M. Able

(57) ABSTRACT

A method is described herein for sintering a frit to a glass plate where the sintered frit and glass plate are subsequently sealed to another glass plate to form a sealed glass package. Examples of the sealed glass package include a light-emitting device (e.g., organic light emitting diode (OLED) device), a photovoltaic device, a food container, and a medicine container.

5 Claims, 7 Drawing Sheets

SEALED GLASS PACKAGE

CROSS-REFERENCE TO RELATED APPLICATIONS

This is a divisional of U.S. patent application Ser. No. 12/156,377 filed on May 30, 2008 now U.S. Pat. No. 7,992,411, and claims the benefit of priority under 35 U.S.C. §120, and is related to U.S. patent application Ser. No. 12/156,202, entitled "Controlled Atmosphere when Sintering a Frit to a Glass Plate", the content of which is relied upon and incorporated herein by reference in its entirety.

TECHNICAL FIELD

The present invention relates to a method for sintering a frit to a glass plate where the sintered frit and glass plate are subsequently sealed to another glass plate to form a sealed glass package. Examples of the sealed glass package include a light-emitting device (e.g., organic light emitting diode (OLED) device), a photovoltaic device, a food container, and a medicine container.

BACKGROUND

Manufacturers of sealed glass packages such as OLED displays (for example) are constantly trying to improve the manufacturing process to more efficiently produce sealed glass packages. One way to improve the manufacturing process by using a new and relatively short sintering process to attach a frit to a glass plate before the sintered frit and glass plate are subsequently sealed to another glass plate to produce a sealed glass package is the subject of the present invention.

SUMMARY

In one aspect, the present invention includes a method for sintering a frit to a glass plate by: (a) providing the glass plate; (b) depositing a frit onto the glass plate, where the frit includes a glass, a filler and a dispersant vehicle; (c) placing the glass plate with the deposited frit into an oven; (d) sintering the frit to the glass plate within the oven where the sintering includes the steps of: (i) ramping-up a temperature within the oven from a first temperature to a second temperature and holding the second temperature for a predetermined time, where the second temperature is high enough to volatize organic ingredients within the dispersant vehicle of the frit but not higher than a glass transition temperature ($T_g$) of the glass in the frit; (ii) ramping-up a temperature within the oven from the second temperature to a third temperature and holding the third temperature within the oven for a predetermined time, where the third temperature is higher than the glass transition temperature ($T_g$) of the glass in the frit but less than a crystallization temperature of the glass in the frit; and (iii) ramping-down a temperature within the oven; and (e) removing the glass plate with the sintered frit from the oven.

In another aspect, the present invention includes a method for sealing a glass package by: (a) providing a first glass plate and a second glass plate; (b) depositing a frit onto the first glass plate, where the frit includes a glass, a filler and a dispersant vehicle; (c) placing the first glass plate with the deposited frit into an oven; (d) sintering the frit to the first glass plate within the oven where the sintering includes the steps of: (i) ramping-up a temperature within the oven from a first temperature to a second temperature by a first ramp rate with a predetermined temperature/predetermined time; (ii) holding the second temperature within the oven for a predetermined time, where the second temperature is high enough to volatize organic ingredients within the dispersant vehicle of the frit but not higher than a glass transition temperature ($T_g$) of the glass in the frit; (iii) ramping-up a temperature within the oven from the second temperature to a third temperature by a second ramp rate with a predetermined temperature/predetermined time; (iv) holding the third temperature within the oven for a predetermined time, where the third temperature is higher than the glass transition temperature ($T_g$) of the glass in the frit but less than a crystallization temperature of the glass in the frit; and (iv) ramping-down a temperature within the oven from the third temperature to a fourth temperature by a third ramp rate with a predetermined temperature/predetermined time; (v) ramping-down a temperature within the oven from the fourth temperature to a fifth temperature by a fourth ramp rate with a predetermined temperature/predetermined time; and (e) removing the first glass plate with the frit from the oven; (f) placing the second glass plate on the frit attached to the first glass plate; and (g) using a sealing device to heat the frit such that the frit melts and forms a seal which connects the first glass plate to the second glass plate.

In yet another aspect, the present invention includes a sealed glass package comprising a first glass plate and a second glass plate, wherein the first glass plate and the second glass plate are connected to one another by a transition metal-lanthanide doped glass frit which formed a seal between the first glass plate and the second glass plate, wherein the transition metal-lanthanide doped glass frit has a predetermined color due to a sintering process which was performed in a reducing atmosphere to attach the transition metal-lanthanide doped glass frit to the first glass plate before the second glass plate was placed on the sintered transition metal-lanthanide doped glass frit and the sintered transition metal-lanthanide doped glass frit was melted to form the seal between the first glass plate and the second glass plate (note: the term transition metal-lanthanide doped glass frit includes a transition metal doped glass frit, a lanthanide doped glass frit or a transition metal and lanthanide doped glass frit).

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 1A:
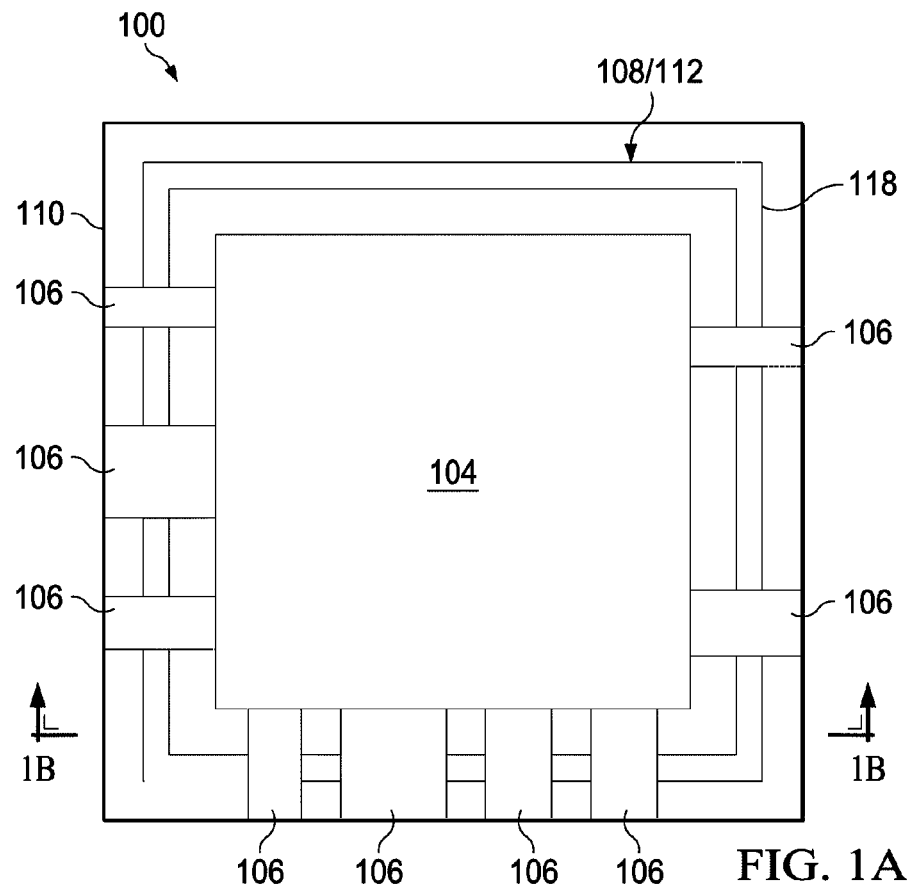
FIGS. 1A and 1B respectively illustrate a top view and a cross-sectional side view of a sealed glass package in accordance with an embodiment of the present invention.
Figure 1B:
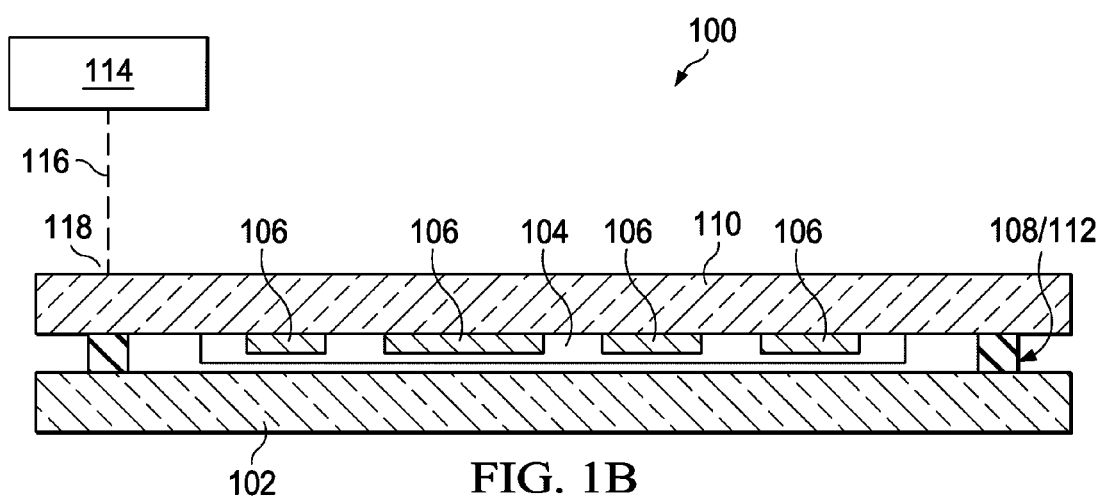
Figure 2:
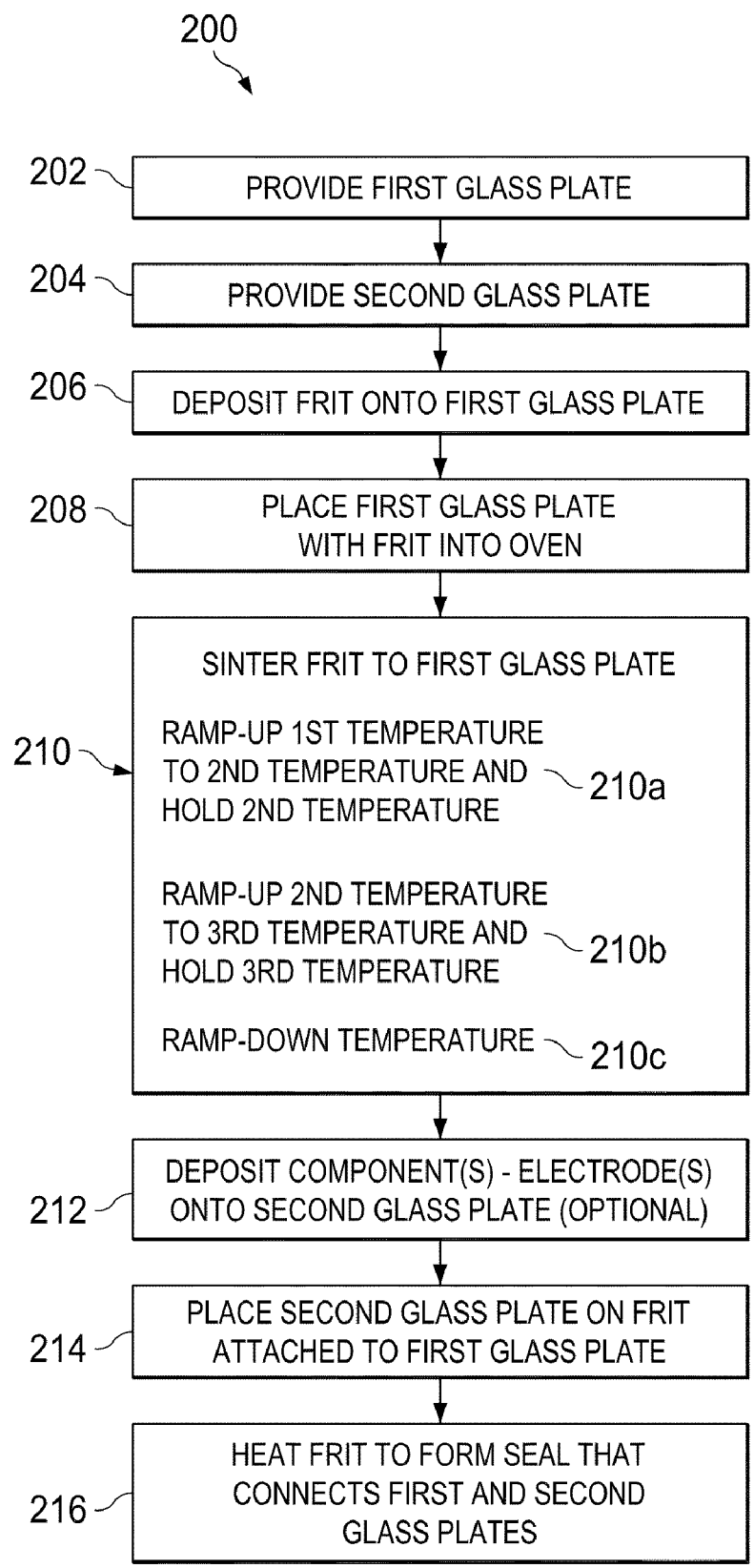
FIG. 2 is a flowchart illustrating the steps of a method for manufacturing the sealed glass package in accordance with an embodiment of the present invention.

Referring to FIGS. 1-2, there are disclosed a sealed glass package 100 and a method 200 for sealing the glass package 100 using an enhanced sintering process in accordance with an embodiment of the present invention. The sealing method 200 is described below with respect to sealing a glass package 100 that includes two glass plates 102 and 110 that are bonded to one another by a frit 108 and where the two glass plates 102 and 110 contain one or more components 104. Examples of the sealed glass package 100 include a light-emitting device 100 (e.g., organic light emitting diode (OLED) device 100), a photovoltaic device 100, a food container 100, and a medicine container 100. However, the present invention should not be construed as being limited to any specific type of sealed glass package 100.

Referring to FIGS. 1A and 1B, there are respectively shown a top view and a cross-sectional side view illustrating the basic components of the sealed glass package 100 in accordance with an embodiment of the present invention. The sealed glass package 100 includes a first glass plate 102, one or more components-electrodes 104 and 106 (optional), a frit 108 and a second glass plate 110. The sealed glass package 100 has a seal 112 (e.g., hermetic seal 112) formed from the frit 108 which contains and protects the one or more components 104 (if present) located between the first glass plate 102 and the second glass plate 110. The electrode(s) 106 (if present) are connected to the component(s) 104 and also pass through the seal 112 so they can be connected to an external device (not shown). The seal 112 is typically located around the perimeter of the glass package 100 such that the component(s) 104 (if present) and at least a part of the electrode(s) 106 (if present) are located within the perimeter of the seal 112. How the glass package 100 is manufactured using the enhanced sintering process and the ancillary components such as the sealing device 114 (e.g., laser 114 and/or infrared lamp 114) are described in greater detail below with respect to FIGS. 2-10.

Referring to FIG. 2, there is a flowchart illustrating the steps of the method 200 for manufacturing the sealed glass package 100 in accordance with an embodiment of the present invention. Beginning at steps 202 and 204, the first glass plate 102 and the second glass plate 110 are provided so that one can make the sealed glass package 100. In one embodiment, the first and second glass plates 102 and 110 are transparent glass plates such as soda lime glass plates or alkaline-earth alumino borosilicate glass plates like the ones manufactured and sold by Corning Incorporated under the brand names of Code 1737 glass, Eagle 2000™ glass, and Eagle XG™ glass. Alternatively, the first and second glass plates 102 and 110 can be transparent glass plates like the ones manufactured and sold by companies such as Asahi Glass Co. (e.g., OA10 glass and OA21 glass), Nippon Electric Glass Co., NHTechno and Samsung Corning Precision Glass Co. (for example). If desired, either or both of the glass plates 102 and 110 could be non-transparent. In addition, the glass plates 102 and 110 could have a coefficient of thermal expansion (CTE) in the range of $30\text{-}110 \times 10^{-7}$ per degree centigrade (° C.).

At step 206, the frit 108 is deposited along the edges of the first glass plate 102 in a manner that the frit 108 forms a closed-loop on a surface of the first glass plate 102. For instance, the frit 108 can be placed approximately 1 mm away from the free edges of the first glass plate 102. The frit 108 is made from a glass (e.g., glass doped with at least one transition metal like iron, copper, vanadium, and neodymium), a filler (e.g., inversion filler, additive filler), and a dispersant vehicle. The filler is typically used to lower the coefficient of thermal expansion (CTE) of the frit 108 so that it matches or substantially matches the CTEs of the two glass plates 102 and 110. In one embodiment, the frit 108 is made of a blend of powdered antimony-vanadate-phosphate glass with β-eucryptite filler that have particle sizes on average below 10 μm or, preferably, less than or equal to 3 μm. And, the dispersant vehicle may be a blend of 2,2,4-trimethyl-1,3-pentadiol monoisobutyrate (brandname of Texanol) and other dispersants (e.g., Anti-Terra, BYK, Solsperse and ethylcellulose) which do not evaporate quickly and keep the solids in suspension between the time that the frit 108 is dispensed onto the glass plate 102 until it is sintered. The compositions of several different exemplary frits 108 which could be used in this particular application with the addition of the dispersant vehicle have been discussed in a co-assigned U.S. Pat. No. 6,998,776 entitled "Glass Package that is Hermetically Sealed with a Frit and Method of Fabrication". The contents of this document are hereby incorporated by reference herein.

At step 208, the first glass plate 102 with the deposited frit 108 is placed into an oven. In one embodiment, the oven can heat-up to temperatures of 400-450° C. while located in a clean room (e.g., Class 1000 clean room). The oven can be electric or gas fired (typically natural gas) and can be made by various manufacturers such as, for example, Blue M, Lindbergh, Glenro, Despatch, HIX, Smit, Thermatrol, Epcon Industrial Systems, Gruenberg, Intek, and Lewco. An electric oven is desirable since it is much cleaner than a gas fired oven. The electric oven can utilize resistance heating elements to heat the air and transfer that energy via convection type heating to the frit 108 and glass sheet 102. Another type of oven that could be used utilizes infrared heating to directly heat the frit 108 and glass sheet 102. In fact, some ovens can use different combinations of these heating methods to heat the frit 108 and glass sheet 102. Alternatively, continuous type sintering ovens with belts, pushers and lehrs can be used to heat the frit 108 and glass plate 102. The continuous type sintering ovens would have different zones through which the frits 108 and glass plates 102 would travel.

At step 210, the frit 108 is sintered to the first glass plate 102 while within the oven where the frit 108 is heated and becomes attached to the first glass plate 102. In particular, the frit 108 is sintered to the first glass plate 102 using the enhanced sintering process in accordance with embodiments of the present invention which takes less than 8 hours, preferably less than 6 hours and more preferably less than 3.25 hours. The enhanced sintering process 210 has multiple steps where first the temperature within the oven is ramped-up from a first temperature to a second temperature which is held for a predetermined time (step 210a). The second temperature is high enough to volatize organic ingredients within the dispersant vehicle of the frit 108 but not higher than a glass transition temperature ($T_g$) of the glass in the frit 108. Second, the temperature within the oven is ramped-up from the second temperature to a third temperature which is held for a predetermined time (step 210b). The third temperature is higher than the glass transition temperature ($T_g$) of the glass in the frit 108 but less than a crystallization temperature of the glass in the frit 108 (step 210b). Thirdly, the temperature within the oven is ramped-down at a predetermined rate to prevent the cracking of the first glass plate 102 with the sintered frit 108 (step 210c). If desired, the sintered frit 108 can be ground to reduce its thickness variation to less than 5-10 μm (for example). Alternative enhanced sintering processes 210 that can be used in this particular application are described below with respect to several experimentally tested glass packages 100. Of course, the alternative enhanced sintering processes 210 can be implemented to make other types of sealing glass packages 100 and not just the experimentally tested glass packages 100.

At step 212 (optional), the components 104 (e.g., OLEDs 104, food 104, medicine 104) and associated electrodes 106 (if needed) are deposited onto the second glass plate 110. This step can be omitted if a glass package 100 is not supposed to contain any components-electrodes 104-106 but instead will contain only a liquid or gas.

At step 214, the second glass plate 110 is placed on the frit 108 that has been attached to the first glass plate 102. For instance, the second glass plate 110 can be placed on top of the frit 108 attached to the first glass plate 102. Or, the first glass plate 102 with the attached frit 108 can be placed on top of the second glass plate 110.

At step 216, the frit 108 may be heated by the sealing device 114 (e.g., laser 114, infrared lamp 114) in a manner such that the frit 108 melts and forms the seal 112 (e.g., hermetic seal 112) which bonds the first glass plate 102 to second glass plate 110 (see FIG. 1B). In addition, the seal 112 protects the component(s) 104 (if any) by preventing, for example, oxygen and moisture located in the ambient environment from entering into the sealed glass package 100. Typically, the frit 108 contains a glass doped with one or more transition metals (e.g., vanadium, iron) and/or a lanthanide (e.g., Nd) so as to enhance its absorption property at the specific wavelength (e.g., 810 nm wavelength) of the light 116 (e.g., laser beam 116) emitted from the sealing device 114 (e.g., laser 114) (see FIGS. 1A-1B). This enhancement of the absorption property of the frit 108 means that the emitted light 116 will be absorbed better by the frit 108 so it will be heated and soften and form the seal 112 (hermetic seal 112). In contrast, the glass plates 102 and 110 should be chosen such that they do not absorb much, if any, irradiation from the sealing device 114. Thus, the glass plates 102 and 110 would have a relatively low absorption at the specific wavelength of the light 116 which would help to minimize the undesirable transfer of heat from the forming seal 112 (hermetic seal) to the components-electrodes 104 and 106 (if present).

If desired, the sealing device 114 can be used to emit a light 116 that heats the frit 108 in a manner where a substantially constant temperature is maintained in the frit 108 along a sealing line 118 that has regions free of electrodes 106 and regions occupied by electrodes 106 (if used) while the frit 108 melts and forms the seal 112 which connects the first glass plate 102 to the second glass plate 110. This can be accomplished even if the electrodes 106 absorb or reflect irradiation from the light 116. The constant temperature sealing technique is described in a co-assigned U.S. Pat. No. 7,371,143 entitled "Optimization of Parameters for Sealing Organic Emitting Light Diode (OLED) Displays". The contents of this document are hereby incorporated by reference herein.

Figure 3:
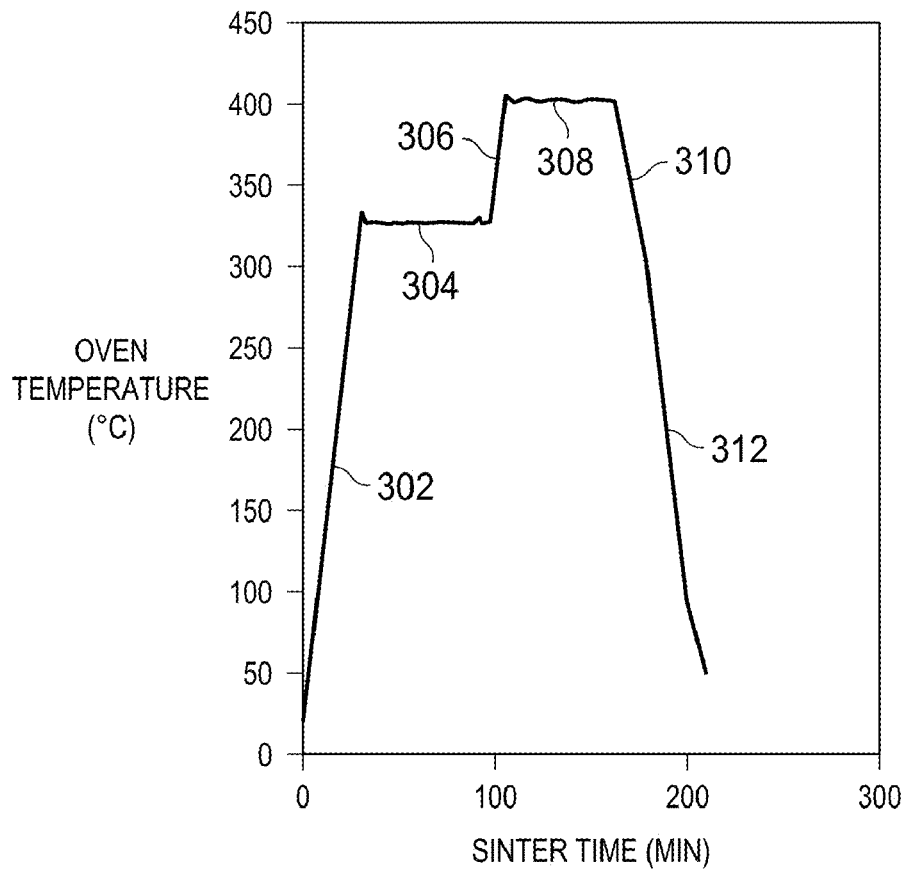
FIG. 3 is a graph used to help explain the steps of an enhanced sintering process used in the manufacturing method of FIG. 2 in accordance with an embodiment of the present invention.

Referring to FIG. 3, there is a graph which is used to help explain an exemplary enhanced sintering process 210 that can be used to sinter a frit 108 to the first glass plate 102 in 3.25 hours in accordance with the present invention. Prior to discussing the enhanced sintering process 210, it should be understood that an experiment is described below where the frit 108 had a specific composition and the first glass plate 102 had a specific composition but it should be appreciated that different types of frits 108 and different types of glass plates 102 could be attached to one another using the present invention. In addition, the following experiment involved the use of particular steps and a particular sequence of steps but it should be appreciated that any of these steps or the particular sequence of steps may or may not be implemented to attach a frit 108 to a glass plate 110 using the present invention. Accordingly, the enhanced sintering process 210 should not be construed as being limited to a specific type of frit 108, a specific type of glass plate 102, a specific step, or a specific sequence of steps.

The following explains the experimental procedure that was used to test an exemplary enhanced sintering process 210 of the present invention. The different procedural steps where as follows:

1. Melt Sb—V-phosphate glass and then melt and crystallize the β-eucryptite which is used as the filler. The Sb—V-phosphate glass had the following composition (mol %): $Sb_2O_3$: 23.5%, $V_2O_5$: 47.5%, $TiO_2$: 1%, $Al_2O_3$: 1%, $Fe_2O_3$: 2.5% and $P_2O_5$%: 27%.
2. Grind the Sb—V-phosphate glass and the β-eucryptite filler to a targeted particle size distribution, in these tests, ≦3 um for the glass and 3 um-7 um for the filler.
3. Blend the powders, by weight, 70% Sb—V-phosphate glass and 30% β-eucryptite filler.
4. Make the dispersant vehicle from a blend of 80.5 wt % Texanol+6.5 wt % each of Anti-Terra 202, BYK 354, Solsperse 900+ethylcellulose added on top.
5. Mix the dispersant vehicle and powder blend to make a frit paste 108.
6. Dispense the frit paste 108 into nine orthogonal patterns on a 6"×6" Eagle 2000™ glass plate 102 (see step 206 in FIG. 2).
7. Place the dispensed frit paste 108 and the glass plate 102 into an oven (see step 208 in FIG. 2).
8. Sinter the dispensed frit paste 108 to the glass plate 102 using the following exemplary enhanced sintering process 210:
    a. Heat 25° C.-325° C. by a ramp rate of 10° C./minute (cumulative time=0.5 hrs) (see step 302 in FIG. 3). This ramp rate is limited by the furnace design and the thermodynamics associated with transferring heat to the glass plate 102 and the frit 108.
    b. Hold 1 hour (in air) and 8 minutes ($N_2$ on) at 325° C. (cumulative time=1.6 hrs) (see step 304 in FIG. 3) (note: for the 8 minutes a reducing gas (like hydrogen) or an inert gas (like nitrogen) can be used where the inert gas, rather than reducing the frit paste 108, helps to prevent the transition metal-lanthanide from being oxidized by the oxygen in the air).
    c. Heat 325° C.-400° C. by a ramp rate of 10° C./minute (cumulative time=1.75 hrs) (see step 306 in FIG. 3).
    d. Hold 1 hour at 400° C. (cumulative time=2.75 hrs) (see step 308 in FIG. 3).
    e. Cool 400° C.-300° C. by a ramp rate of 6° C./minute (cumulative time=3 hrs) (see step 310 in FIG. 3).
    f. Cool 300° C.-60° C. ($N_2$ off, full air on for cooling) by a ramp rate of 16° C./minute (cumulative time=3.25 hrs) (see step 312 in FIG. 3).
9. Remove the sintered frit 108 and glass plate 102 from the oven.
10. Seal the sintered frit 108 and glass plate 102 to the other glass plate 110 to form the sealed glass package 100 (see step 216 in FIG. 2). In this case, the sealing device 114 (e.g., 810 nm sealing device 114) and associated components had been located in a Class 1000 clean room.

The exemplary enhanced sintering process 210 (steps 8a-8f) is described in more detail next to help further explain why these temperatures and times had been used with this particular frit 108 and glass plate 102. The lower hold temperature of 325° C. associated with step 304 was selected to volatilize the organic ingredients of the dispersant vehicle while remaining below the Tg of the frit's glass such that the glass does not flow on top of the glass plate 102. The hold time of 1 hour and 8 minutes associated with step 304 (which could be shortened) was selected to give the dispersant vehicle time to volatilize and burn off organic components that are used to suspend the glass frit components for the dispensing step 206, and during the last 8 minutes, the $N_2$ supply is turned on so that $N_2$ at least partially displaces the air before the top temperature (e.g., glass $T_g$) is reached at step 306. The $N_2$ helps to prevent the oxidation of the vanadium (or other transition metal or lanthanide) in the frit's glass from the oxygen in the air so that the glass is durable and has an enhanced absorption property at the specific wavelength (e.g., 810 nm wavelength) of the light 116 (e.g., laser beam 116) emitted from the sealing device 114 (e.g., laser 114). Alternatively, a reducing gas like hydrogen can be used instead of the inert gas to reduce the vanadium (or other transition metal or lanthanide) in the frit's glass so that the glass is durable and has an enhanced absorption property at the specific wavelength (e.g., 810 nm wavelength) of the light 116 emitted from the sealing device 114.

The higher hold temperature at step 308 was 400° C. but it could be between 385° C. and 415° C. to avoid a problematical denitrification of the frit 108. The hold time at step 308 was set at 1 hour, but additional experiments have shown that this hold time could be ≦30 minutes. In fact, the ramp rates and holds aspects of this exemplary sintering process 210 (steps 8a-8f) were generally set in view of the oven design, load in the furnace, and physics of conduction to transfer heat from the glass plate 102 to the frit 108. If desired, the ramp rates and hold times could be changed to be slower and sometimes faster.

In addition, at the higher hold temperature of step 308, the oxygen level content within the oven during this particular experiment was maintained at approximately 50 ppm. But, if desired the oxygen level content could be maintained at a predetermined level somewhere within a range of about 50 ppm-22,220 ppm and these levels would still work to control the vanadium oxidation state in the exemplary vanadium-doped glass frit 108 which helps control how well the sintered frit 108 absorbs the 810 nm light 116 that is emitted from the sealing device 114. A more detailed discussion about controlling the oxygen level within the range of about 1,200 ppm-22,220 ppm is provided in the aforementioned related U.S. patent application Ser. No. 12/156,202 filed concurrently herewith and entitled "Controlled Atmosphere when Sintering a Frit to a Glass Plate". The contents of this document are hereby incorporated by reference herein.

The frit sealing step 216 of FIG. 2 (step 10 according to the above experiment) can be performed under different conditions but in this set-up if the sintered frit 108 is sealed at high speed (e.g., 10-50 mm/minute) and low power (<37 W), then the frit seal 112 will be hermetic. The frit sealing conditions are also dependent upon the specific equipment (e.g., sealing device 114) but processes can be developed for determining the optimum sealing power and speed under test conditions which can then be used in the manufacturing conditions. In this particular experiment, the sealing device 114 was located in a Class 1000 clean room and the optimum sealing conditions for the relatively short 3.25 hour sinter processing step 210 was determined using a sealing window and sealing window inspection technique (see TABLE #1). The results of this test are depicted in TABLE #1 which indicates that for this particular set-up the two glass plates 102 and 112 could be sealed to one another by the frit 108 with an acceptable minimum sealing power of 27 watts, acceptable maximum sealing power of 30 watts, and optimal sealing power of 28 watts.

TABLE #1

Sealing Window and Sealing Inspection for 3.25 hr cycle

| Cycle Time (hrs) | Sealing Speed mm/sec | Sealing Power resulting in optimum cells (W) | Defocus | Seal Width (%) |
|---|---|---|---|---|
| 3.25 | 20 | 30 | 6.1 | 77.84 |
| 3.25 | 20 | 29 | 6.1 | 76.62 |
| 3.25 | 20 | 28 | 6.1 | 76.14 |
| 3.25 | 20 | 27 | 6.1 | 70.88 |

To further test the seal quality and integrity of the resulting sealed glass package 100, a water immersion test with vacuum was performed. Twenty sealed glass packages 100 that were sintered using the shorter 3.25 hour sintering process 210 were subsequently tested for leaking (bad seal) and in this case there was an acceptable 88 and 92 percent yield of sealed glass packages 100. Thus, the relatively shorter 3.25 hour sintering process 210 does not appear to adversely affect the final seal quality and product. In these experiments, it was also found that the hermetic frit seal 112 in the sealed glass package 100 that was made using an 810 nm sealing device 114 had a dark brown color which was found to be indicative of an efficient and cohesive seal 112. It is believed the hermetic seal 112 has dark brown-black colored frit 108 because of the presence of a reduced vanadium species such as $V^{+3}$ in the frit 108 that is caused by the non-oxidizing or reducing conditions (through the use of an inert gas or reducing gas) during sintering. As discussed above, the reduced vanadium species absorbs more 810 nm light 118 from the sealing device 114 than a non-reduced vanadium species in the frit 108.

Following are some additional features and advantages of using the relatively short 3.25 hour sintering process 210 when manufacturing sealed glass packages 100.

A short sintering schedule 210 allows more throughput which is important for a manufacturing process.

For example, with the 8 hour sintering schedule 210 one could get 118 larger Gen 4.5 sized fritted cover sheets 102 and 108 throughput per day, and with the 3.25 hour sintering schedule 210 one could get 280 larger Gen 4.5 sized fritted cover sheets 102 and 108 throughput per day using the same oven (e.g., SMIT oven).

The shorter 3.25 hour sintering schedule 210 is also desirable since there will be less operating expenses for energy, etc.

The more throughput and less operating expenses associated with using a shorter 3.25 hour sintering schedule 210 makes the sintering step less of a rate limited factor that could possibly be a deterrent for the manufacturing capabilities of sealed glass packages 100 like OLEDs.

The shorter 3.25 hour sintering schedule 210 does not adversely affect the frit seals 112.

A discussion is provided next about various experiments that were conducted while testing different frits 108 and different sintering processes 210 associated with the present invention. The results of these experiments ultimately lead to the aforementioned exemplary 3.25 hour sintering schedule 210. It should be appreciated that the specific compositions of the tested frit 108 and the tested glass plates 102 described herein are not to be considered limiting to the present invention and in fact the present invention can be used with many different types of frits 108 and many different types of glass plates 102. In addition, the experiments described herein involved the performance of specific steps and a specific sequence of steps but it should be appreciated that any of the steps or sequence of steps may or may not be used to attach any frit 108 to any glass plate 102 using the present invention.

The discussion that follows chronicles the development of the 3.25 hour sintering schedule 210 and summarizes many sintering studies that where performed to examine ramp rates, hold times, atmospheres, and frit blends, to quantify the impact that these conditions have on the properties of the frit 108 itself and the resulting frit seal 112.

In the early experiments, the frit paste 108 could be dispensed with the correct width but not the targeted height or plateau profile. As a result, the sintered frit 108 had to be manually ground to the targeted height, washed to remove the excess frit, grit, and contaminants, and then dried to remove absorbed water left from the washing. As a result, a sintering process 210 was developed to ensure that the frit 108 adhered to the glass plate 102 could withstand the grinding, washing, and drying steps. In particular, a sintering process 210 was designed that would: (1) drive off water and allow the pine oil which was the dispersant vehicle in the frit 108 to flow and make the paste smoother and less porous (hold for 1 hour at 100° C.); (2) burn off the organics in the dispersant vehicle (hold for 1 hour at 300° C.); and (3) adhere firmly to the glass plate 102 (hold at 450° C. for 1-2 hours). The ramp rates were 5° C./minute and the sintering atmosphere was air. This sintering process 210 has the following schedule:

TABLE #2

| T (deg C.) | T (deg C.) | Ramp (deg/min) |
|---|---|---|
| 25 | 100 | 5 |
|  | 100 | Hold 1 hour |
| 100 | 300 | 5 |
|  | 300 | Hold 1 hour |
| 300 | 450 | 5 |
|  | 450 | Hold 1 hour |

These early studies were done in laboratory-scale ovens using a first tested frit paste 108 that had the following composition:

TABLE #3

| 895AOT Glass 5-10 um powder | | β-eucryptite 3-10 um powder | |
|---|---|---|---|
| Oxide | mol % | Oxide | mol % |
| Sb2O3 | 23.50 | LiO2 | 25.00 |
| V2O5 | 47.50 | AL2O3 | 25.00 |
| P2O5 | 27.00 | SiO2 | 50.00 |
| TiO2 | 1.00 |  |  |
| Al2O3 | 1.00 |  |  |

Note:
the first tested frit 108 was made from a powder blend of 70 wt % 895AOT glass with a particle size in the range of 5-10 μm, + 30 wt % β-eucryptite filler with a particle size of 5-10 μm air classified. This particular frit 108 had a frit to vehicle ratio (FVR) of 2.7 and a dispersant vehicle of pine oil plus Emphos.

As the requirements changed, so did the glass composition, particle size distribution, composition of the dispersant vehicle, method of mixing the frit paste, equipment and pattern used in dispensing the frit paste, sintering schedule, sintering atmosphere, and sealing conditions. Basically, the grinding step was eliminated and this forced many of these changes. To make the frit 108 flat on the glass plate 102 without performing the grinding step, a "no-grind" project was started that evaluated different frit 108 to glass plate 102 dispersing techniques. Dispensing techniques such as screen printing (e.g., at Dek) and Micropen (e.g., at Ohmcraft) required a different formulation of frit paste 108 for the following reasons: (1) the pine oil (+Emphos) evaporated or separated from the solids in the first tested frit paste 108 during screen printing or dispensing by Micropen; (2) the frit-to-vehicle ratio (FVR) of 2.7-3.0 and viscosity of the first tested frit paste 108 was too high for Micropen dispensing; and (3) the coarse particles >10 μm of the powder of the first tested frit 108 would not dispense well on the Micropen when the distance between the pen opening and the glass plate 102 was ~10 μm. Thus, the pine oil+Emphos were substituted with a blend of 2,2,4-trimethyl-1,3-pentadiol monoisobutyrate (brand name Texanol) and other dispersants (e.g., Anti-Terra, BYK, Solsperse and ethylcellulose) which keep the solids suspended longer and do not evaporate as quickly. Also, the FVRs were evaluated and the viscosity of the frit 108 was controlled by the amount of ethylcellulose added. The particle sizes of the frit's glass and filler was reduced to keep the extra coarse particles (>10 μm) out of the frit 108. This second tested frit paste 108 had the following composition:

TABLE #4

| 895AOC Glass 3-10 um powder | | β-eucryptite 3-10 um powder | |
|---|---|---|---|
| Oxide | mol % | Oxide | mol % |
| Sb2O3 | 23.50 | LiO2 | 25.00 |
| V2O5 | 47.50 | AL2O3 | 25.00 |
| P2O5 | 27.00 | SiO2 | 50.00 |
| TiO2 | 1.00 |  |  |
| Al2O3 | 1.00 |  |  |

Note:
the second tested frit 108 was made with the powder blend 70 wt % 895AOC glass with a particle size of 3-10 μm + 30 wt % β-eucryptite filler with a particle size of 3-10 μm air classified. This particular frit paste 108 had a frit to vehicle ratio (FVR) of 2.5, where the dispersant vehicle included Texanol plus additives with 3% ethylcellulose (EC)(FLV-31).

The "no-grind" second tested frit paste 108 was developed to match the requirements of precision dispensing onto the glass plate 102. However, the aforementioned sintering schedule 210 (associated with the first tested frit paste 108) was not modified at first to take into consideration the finer particles of the frit's glass and the β-eucryptite filler, the new dispersant vehicle composition, and the larger ovens which where used to sinter the second tested frit paste 108 to the glass plate 102. Plus, the top hold temperature of 450° C. crystallized the secondary phases in the second tested frit's glass which is believed to be detrimental to a good frit seal 112 because of the compromised CTE mismatch between the frit 108 and the glass plate 102. The crystallized secondary phases in the second tested frit's glass also reduced the amount of glass in the frit paste 108 that would be available to flow during the laser sealing step 216. As a result, when the "no-grind" second tested frit paste 108 was sintered using the aforementioned sintering schedule 210 (TABLE #2) it would not seal to the glass plates 102 and 110 as expected.

This problem was not likely to be caused by a vehicle burn-out issue since that occurs at much lower temperatures (<400° C.) than the sealing temperature of ~650° C. Plus, when the first tested frit paste 108 had been sintered at different top temperatures in the range 400-500° C. these sintered tested frits 108 where found to have large differences in appearance which were attributable to pores in lower temperature samples (400° C.), and secondary crystalline phases in higher temperature samples (~500° C.), with the medium temperature samples (450° C.) looking as they "should"— that is, having a dark brown color. However, when the second tested frit paste 108 had been sintered to 450° C., they had a different microstructure than the first tested frit 108 since they had isolated pockets of devitrification that were inconsistent with the more continuous devitrification that had been observed in the sintered first tested frit 108. In fact, the isolated pockets in the second tested frits 108 seemed to be associated with pockets of porosity. This indicated that the second tested frits 108 were being sintered at too high a top temperature when using the aforementioned first sintering process 210 (see TABLE #2). As such, another experiment was conducted to study the effects of the top temperature and to address this particular problem.

The next experiment was conducted to test the effect that a sintering top temperature in the range 430-480° C. had on the micro-texture (e.g., crystals and pores) of the second tested frit 108 (and a third tested frit 108) and how well the second tested frit 108 (and the third tested frit 108) sealed so as to optimize a no-grind sintering schedule 210. Again, the second tested frit 108 was made with the powder blend 70 wt % 895AOC glass with a particle size of 3-10 μm plus 30 wt % β-eucryptite filler with a particle size of 3-10 μm air classified. This particular frit paste 108 had a frit to vehicle ratio (FVR) of 2.5, where the dispersant vehicle contained Texanol plus additives with 3% ethylcellulose (EC)(FLV-31)(see TABLE #5). The third tested frit 108 was made with the powder blend 70 wt % 895AOC glass with a particle size <3 μm plus 30 wt % β-eucryptite filler with an air classified particle size <3 μm). This particular frit paste 108 had a frit to vehicle ratio (FVR) of 1.0, where the dispersant vehicle contained Texanol plus additives with 1.5% ethylcellulose (EC) (FLV-34)(see TABLE 5).

TABLE #5

| Ingredient | wt % |
| --- | --- |
| Anti-Terra 202 (51% solids) | 6.5 |
| BYK 354 (50% solids) | 6.5 |
| Solsperse 9000 | 6.5 |
| Texanol | 80.5 |

Dow 100 ethylcellulose is added to the Texanol Blend

In this particular experiment, the second tested frit pastes 108 (samples 37-21 through 37-49) had been dispensed in 2"×2" patterns on Code 1737 glass plates 102. Plus, the first, second and third frit pastes 108 had been deposited as blobs of pastes on Al foil boats. All of them were then sintered in small low-temperature furnaces using the aforementioned sintering schedule 210 (see TABLE #2) except that the top temperature was either 430° C., 440° C., 450° C., 460° C., or 480° C. The sample numbers and top temperatures have been identified in TABLE #6. The blobs of sintered frit paste were analyzed by x-ray diffraction (XRD) for secondary phases. Most of the sintered second tested frit pastes 108 on the 2"×2" 1737 glass plates 102 were examined for relative porosity and characterized for relative adherence to the Code 1737 glass plate 102. The remaining sintered second tested frit pastes 108 on the 2"×2" 1737 glass plates 102 were examined after undergoing a sealing test.

TABLE #6

| Top Temp. (° C.) | Second Tested Frit-Sample Nos. | Blobs of Frit Paste |
| --- | --- | --- |
| 430 | 21, 30, 37, 28 | 2nd/3rd tested frits |
| 440 | 45, 41, 40, 39 | 2nd/3rd tested frits |
| 450 | 42, 44, 49, 46 | 1st/2nd/3rd tested frits |
| 460 | 34, 33, 28 | 1st/2nd/3rd tested frits |
| 460 | 27 | 2nd/3rd tested frits |

Figure 4:
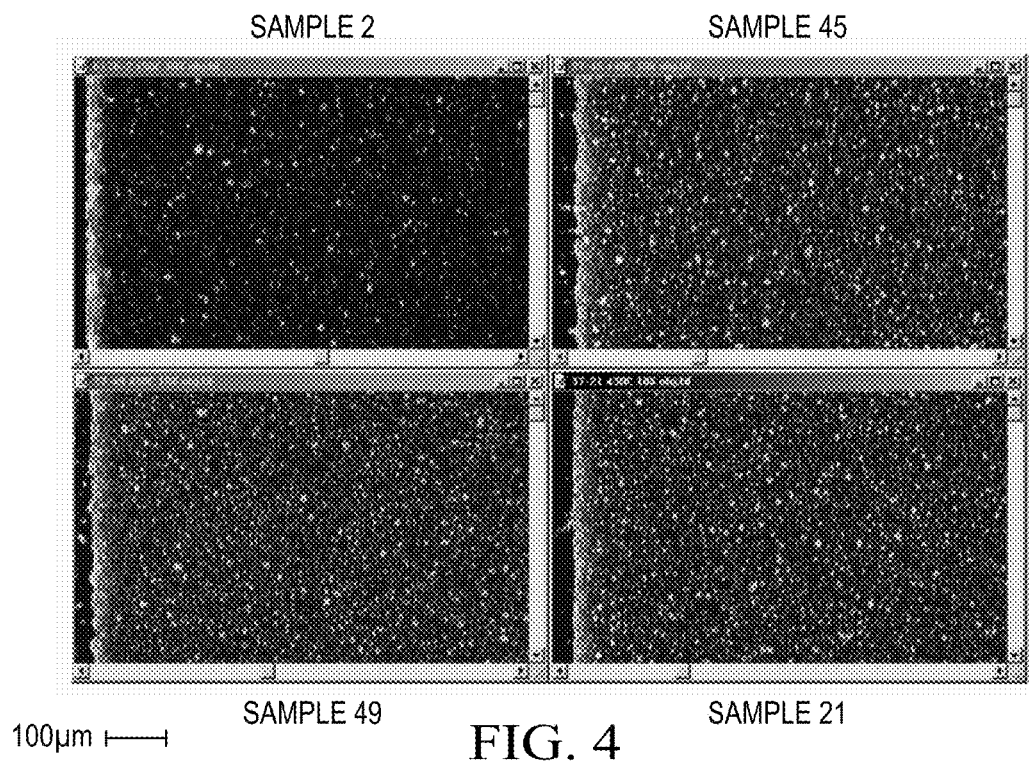
Figure 5:
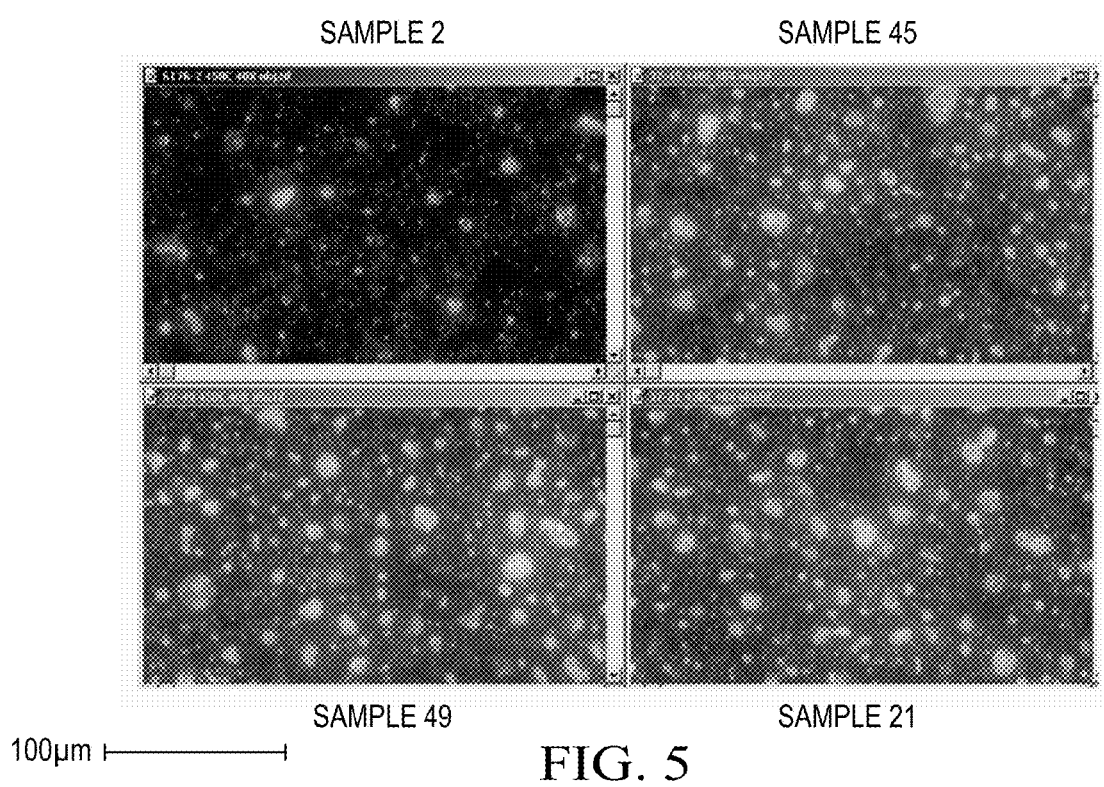

The blobs of the second and third tested frit pastes 108 for 430° C. ran together since they had been put on the same Al foil boat and could not be analyzed, but the other second and third tested frit pastes 108 were put on separate Al foil boats and tested for the other temperatures. The second tested frit pastes 108 (samples 46 and 49) tested at 450° C. were unintentionally re-sintered in a later experiment so they could not be used. However, the second tested frit pastes 108 including samples 21 and (430° C.), 39 and 45 (440° C.), 49 (450° C.), 28 and (460° C.), and 27 (480° C.) underwent microscopic analysis. The first tested frit pastes 108 including samples 2 (450° C.), 3 (460° C.), and 4 (480° C.) also underwent microscopic analysis. FIG. 4 has 10× photomicrographs comparing sample 2 (450° C.) of the first tested frit paste 108 with samples 49 (450° C.), (440° C.) and 21 (430° C.) of the second tested frit paste 108. FIG. 5 has 40× photomicrographs of the same samples.

Figure 6:
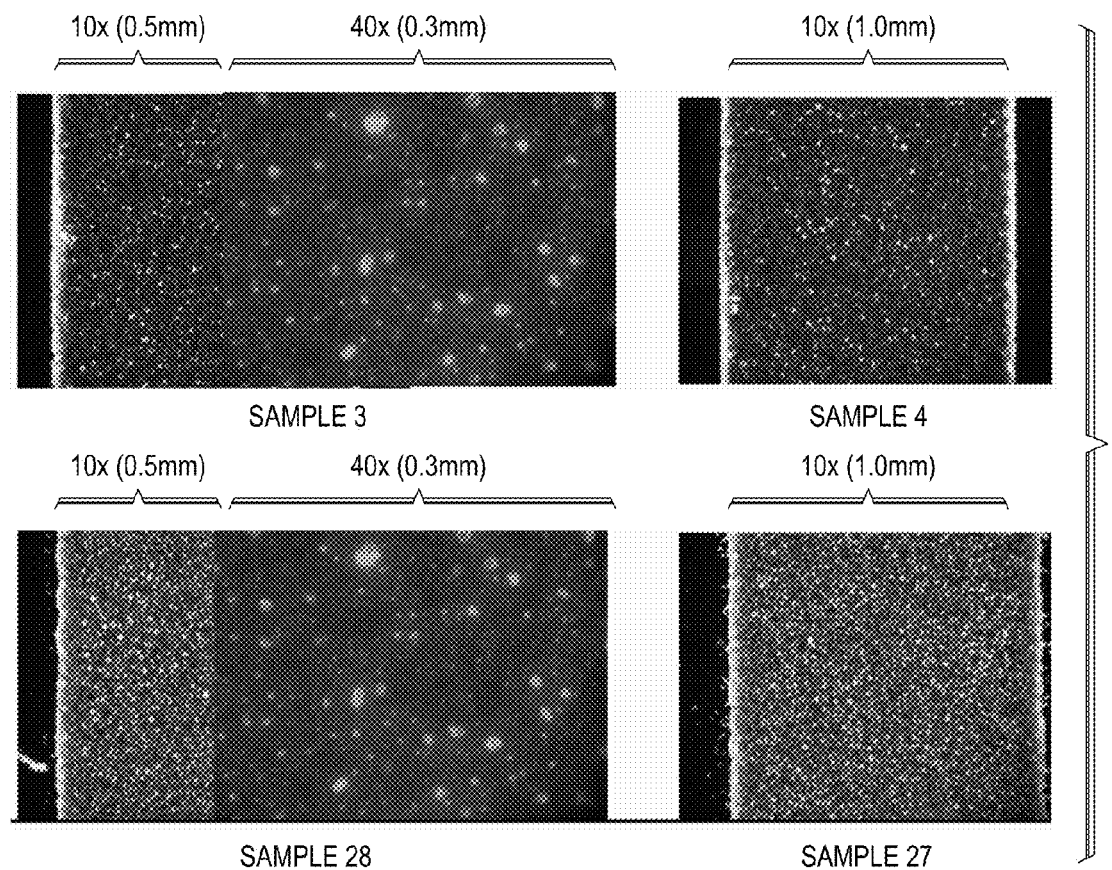

The most obvious difference that can be seen in these photomicrographs is between sample 2 and sample 49 where sample 2 has smaller and fewer pores than sample 49 when they both had been sintered at the top temperature of 450° C. However, the differences were relatively minor between the samples 21, 45 and 49 associated with the second tested frit paste 108, regardless of the top temperature (see FIGS. 4-5). FIG. 6 shows 10× and 40× photomicrographs comparing samples 3 (460° C.) and 4 (480° C.) of the first tested frit paste 108 with samples 28 (460° C.) and 27 (480° C.) of the second tested frit paste 108. These images show the difference in the number and size of pores of the samples 3, 4, 27 and 28 regardless of the top sintering temperature. As can be seen, the samples 27 and 28 of the second tested frit paste 108 had many more pores than the samples 3 and 4 of the first tested frit paste 108. This greater amount of porosity in samples 27 and 28 of the second tested frit paste 108 may have resulted from non-ideal particle packing after the vehicle had volatilized.

Plus, the samples 27 and 28 had devitrified glass so there were crystals inside of the pores (note: the crystals are bright white inside of the white pores) (see also sample 2 in FIGS. 4-5). The crystals in these sintered frit pastes 108 were identified by XRD as being: $(Sb_xV_x)O_4$: $Sb_{0.92}V_{0.92}O_4$, $(Sb_{0.95}V_{0.95})O_4$, $(Sb_{0.96}V_{0.96})O_4$, $(Sb_{0.9}V_{0.1})O_4$, and the lithium species of $Li_{0.04}V_2O_5$ and $Li_2SiO_3$. Even though the frit's glass is a phosphate glass, there are no P-containing minerals, and the origin of the Li and Si is the β-eucryptite filler. It is clear that the finer particles and Texanol vehicle of the second tested frit paste 108 (3-10 μm) versus the larger particles and pine oil vehicle of the first tested frit paste 108 (5-10 μm) resulted in larger and more pores being formed as the vehicle volatilized, and after the nucleation of fine crystals within those pores.

Figure 7:
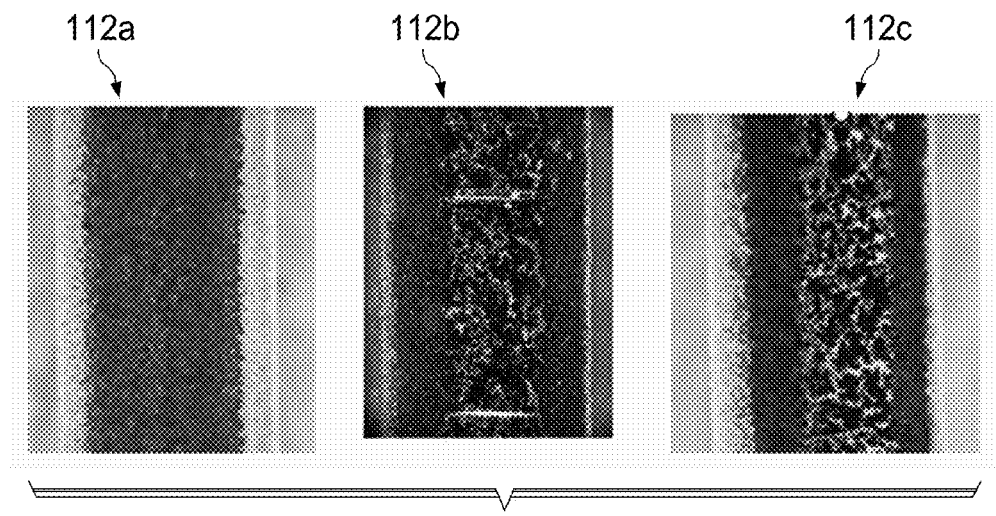

In this test, the temperatures equal to or greater than 430° C. appeared to be too high for sintering the samples that were made from the second tested frit paste 108. However, when the second tested frit 108 was sintered at lower temperatures (i.e., 400° C.), it was laser-sealable without grinding, whereas the same lot of frit paste that had been sintered at higher temperature (≧430° C.) could not be laser-sealed under the same conditions but instead they needed more laser power to seal for a given speed and defocus. FIG. 7 shows a photo of a good seal 112a from the second tested frit 108 which was sintered at top temperature of 400° C., and photos of bad seals 112b and 112c from the second tested frit 108 which had been respectively sintered at 430° C. (stress fracture) and at 450° C. (delamination)(note: the frit widths of seals 112a, 112b and 112c are 1 mm wide). In view of these photos, it is believed that during laser sealing the crystals did not melt or flow so they prevented the heat of the laser 114 from being transferred into the second tested frit 108, thereby forming a poor seal 112b and 112c.

There are several ways one could use to get the second tested frit 108 (or any type of transition metal doped glass frit 108) to absorb more 810 nm radiation (for example): (1) lower the top sintering temperature to avoid growing the secondary phases which would increase the amount of glass in the frit 108 that is available for flowing and sealing; (2) sinter in a reducing atmosphere ($N_2$, forming gas, or $H_2$) to reduce the vanadium to $V^{+3}$ or $V^{+2}$ in the frit's glass during the hold at the top temperature; (3) dope the filler material with vanadium that would be $V^{+3}$ or $V^{+2}$; and/or (4) add Fe or some other element(s) to the frit's glass that would help keep the vanadium reduced. In conclusion, the top temperature for sintering the no-grind second tested frits 108 is ≧430° C. and 400° C. works well.

Another experiment was performed to test the impact that different sintering top hold temperatures and different sintering hold times had on the properties of the "no-grind" second tested frit 108. This particular experiment was conducted to determine if different hold temperatures and times would affect the frit's porosity, whether the frit's glass devitrifies, and how well the frit 108 seals to the glass plate 102 (in this case a Code 1737 glass plate 102). The furnace atmosphere was air and the up-ramp rates were slowed to 2.5° C./minute to better match the capabilities of the furnace which is comparable to older production-scale furnaces. The hold time at 100° C. was eliminated because there was little evidence that batched or adsorbed water was not driven off during the ramp up to higher temperatures. The top temperatures of 350° C. or 400° C. were high enough to volatilize the frit's organics but low enough to avoid the frit's denitrification. The lower hold temperatures of 200° C. or 250° C. were chosen since the TGA (thermogravitational analysis) of Texanol showed that 99.9% of it was gone by 174° C. Since the sintering schedule should be as short as possible (e.g., <8 hours) to accommodate as many runs per day as possible, the hold times were 30 minutes or 2 hours at the top temperature. The furnace schedules was as follows:

(a) 25° C.—lower temperature (either 200 or 250° C.)
(b) Hold 1 hour.
(c) Lower temperature-higher temperature (350 or 400° C.)
(d) Hold at the top temperature for 0.5 or 2 hours.

The run numbers for this experiment identifying the middle and top temperatures and hold times are listed in TABLE #7.

TABLE #7

| Run # | Middle Hold T (° C.) | Top Hold T (° C.) | Top Hold Time (hr) |
|---|---|---|---|
| 1 | 250 | 400 | 0.5 |
| 2 | 250 | 350 | 2 |
| 3 | 250 | 400 | 2 |
| 4 | 250 | 350 | 0.5 |
| 5 | 200 | 400 | 0.5 |
| 6 | 200 | 350 | 2 |
| 7 | 200 | 400 | 2 |
| 8 | 200 | 350 | 0.5 |
| 9 | 300 | 450 | 1 |

To maximize what could be learned from this particular experiment, several different frit pastes 108 were used which had compositions as follows:

TABLE #8

| Sample Code | Glass | Beta-Eucryptite Filler |
|---|---|---|
| 6267 | 70%, 895AOC (3-10 µm, air classified) | 30%, (3-10 µm, air classified) |
| 6268 | 70%, 895AOC (<3 µm, air classified) | 30%, (<3 µm, air classified) |
| 6176 | 70%, 895AOC (5-10 µm, air classified) | 30%, (5-10 µm, air classified) |
| 6244 | First Tested Frit | First Tested Frit |

All of these frit powders were x-rayed before the heat-treatment (sintering process) to confirm that only β-eucryptite was present. The powders of samples 6267, 6176 and 6244 were pre-dried at 200-250° C. before being batched. TABLE #9 identifies the batch numbers, sample codes, and vehicle details.

TABLE #9

| Sample # | Powder Blend | Vehicle | Recipe | |
|---|---|---|---|---|
| 106 = 97 | 6244 | Texanol | FVR 1.5 | 5% EC |
| 107 = 96 | 6176 | Texanol | FVR 1.5 | 5% EC |
| 108 = 37 | 6267 | Texanol | FVR 2.5 | 3% EC |
| 85 | 6176 | Pine Oil | FVR 2.7 | Emphos |
| 61 | 6268 | Texanol | FVR 1.0 | 1.5% EC |

In this test, 40 gram batches of frit paste #96 (=#107) and #97 (=#106) had been mixed. The frit pastes #61 and #85 had been used in another experiment, so they were re-rolled to make sure they were properly mixed. Then, frit samples were dispensed as #96-11 through #96-30, #97-11 through #97-30, and #37-10 through #37-18 onto Code 1737 glass plates 102. In addition, blobs of several frit samples were held in Al foil dishes and placed side-by-side to the 2"×2" 1737 glass plates 102 that had located thereon the dispensed lines of the frit pastes 108. After being sintered, the blobs from the conditions R3, R8, and R9 listed in TABLE #7 were analyzed by XRD to identify any secondary phases that might have crystallized. Half of the 2"×2" Code 1737 glass plates 102 were examined for porosity and secondary crystals (via SEM and backscattered electron imaging), and the other half of the 2"×2" Code 1737 glass plates 102 were submitted to undergo sealing tests (see TABLE #10).

TABLE #10

| Run # | Run Time (hour) | Furnace # | Samples | 2" × 2"s | | | | |
|---|---|---|---|---|---|---|---|---|
| R1 | 6.5 | 10 | 106 107 108 | 96-17 | 96-18 | 97-17 | 97-18 | 37-11 (furn. 11) |
| R2 | 7.3 | 11 | 106 107 108 61 85 | 96-15 | 96-16 | 97-15 | 97-16 | 37-12 (furn. 12) |
| R3 | 8.0 | 12 | 106 107 108 | 96-25 | 96-26 | 97-25 | 97-26 | 37-16 |
| R4 | 5.8 | 12 | 106 107 108 | 96-19 | 96-20 | 97-19 | 97-20 | 37-10 |
| R5 | 6.5 | 11 | 106 107 108 | 96-21 | 96-22 | 97-21 | 97-22 | 37-15 |
| R6 | 7.3 | 12 | 106 107 108 | 96-13 | 96-14 | 97-13 | 97-14 | 37-13 (furn. 10) |
| R7 | 8.0 | 11 | 106 107 108 | 96-27 | 96-28 | 97-27 | 97-28 | 37-17 |
| R8 | 5.8 | 10 | 106 107 108 61 85 | 96-23 | 96-24 | 97-23 | 97-24 | 37-14 |
| R9 | 8.4 | 10 | 106 107 108 61 85 | 96-29 | 96-30 | 97-29 | 97-30 | 37-18 |

Note:
the samples in BOLD were the ones examined for porosity and secondary crystals.

The XRD data for the extreme conditions of R3 and R8 and the standard conditions of R9 are shown in TABLE #11.

TABLE #11

| Sample # | Powder Blend | As-made | R9 ("std") | R8 (+++) | R3 (---) |
|---|---|---|---|---|---|
| 106 = 97 | 6244 | 0 | (SbV)O4 | 0 | 0 |
| 107 = 96 | 6176 | 0 | (SbV)O4 | 0 | 0 |
| 108 = 37 | 6267 | 0 | (SbV)O4 | 0 | 0 |
| 85 | 6176 | 0 | (SbV)O4 | 0 | 0 |
| 61 | 6268 | 0 | (SbV)O4 | 0 | 0 |

Note:
0 = just β-eucryptite.
As-made = the powder before being made into paste.
R8 (+++) = (250° C./400° C./2 hrs hold).
R3 (---) = (200° C./350° C./0.5 hrs hold).
R9 ("std") = (300° C./450° C./1 hr hold).

As can be seen, the samples that had crystals of $(Sb_xV_x)O_4$ are only within the samples that had been sintered by the R9 schedule, illustrating that the top temperature of 450° C. is too hot for sintering these particular exemplary frit pastes 108, and that 400° C. worked well.

Figure 8:
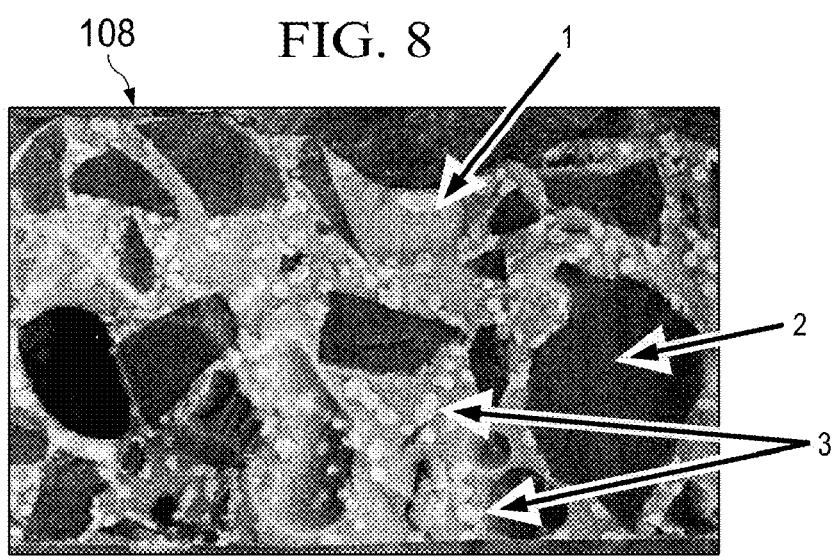
FIGS. 4-10 are various photos and graphs which indicate the results of various experiments conducted to test exemplary sintered frits-glass plates and exemplary sealed glass

FIG. 8 shows the SEM results in a backscattered electron image of a fractured surface of the sample #97 of the second tested frit 108 that had been sintered to a top temperature of 450° C. using the R9 schedule. In this photo, the frit's glass is identified by reference "1", the β-eucryptite filler is identified by reference "2" and the $(Sb_xV_x)O_4$ crystals are identified by reference "3". As can be seen, the $(Sb_xV_x)O_4$ crystals, about 0.5 μm across, are distributed randomly throughout the frit 108 and they look like spherical crystallites.

In this particular experiment, it was also noticed that the sintered 2"×2" Code 1737 glass plates 102 had frits 108 with a height of about 60 μm and a mound profile rather than the targeted 15 μm and a mesa. Because of this dispensing error, only a limited evaluation of frit paste compositions and the sealing conditions could be performed. However, the experiment still resulted in some successes with sealing the frit samples 37-10 through 37-18 (R1-R8) as well as the frit samples 97-24 (R8), 97-25 (R3), and 97-(R9). The observations from the sealing tests have been summarized in TABLE #12:

TABLE #12

| Run # | Sample # | Sealing Speed (mm/s) | Power | Observations |
|---|---|---|---|---|
| R1 | 37-11 | 0.5 | 52% | narrow seals and porosity, 54-56%: wider seals, microcracking |
| R2 | 37-12 | 1.0 | 50% | wide seal (80-90%), porosity |
| R3 | 37-16 | 0.5 | 52% | good seal, microcracking, slightly porous |
| R4 | 37-10 | 1.0 | 50% | wide seal (80-90%), porosity |
| R5 | 37-15 | 1.0 | 48% | good seal |
| R6 | 37-13 | 1.0 | 50% | wide seal (80-90%), porosity |
| R7 | 37-17 | 0.5 | 52% | narrow seals and porosity, 54-56%: wider seals, microcracking |
| R8 | 37-14 | 0.5 | 52% | good seal, microcracking, slightly porous |

The frit samples 97-24 (R8), 97-25 (R3), and 97-29 (R9) were also sealed from the backside to determine if the frit 108 had flowed and sealed. In fact, these samples were irradiated with multiple passes at a speed of 1 mm/sec using different irradiation powers. Sample 97-29 (R9, "std") yielded a seal width of ~65% after 3 passes with 50% power and the frit 108 did not darken when irradiated (recall the exemplary frits 108 described herein preferably had a dark brown color after the sealing step 216). Sample 97-25 (R3, ---) had a seal width similar to sample 97-29 but was porous and the frit darkened moderately when it was irradiated by the laser 114. Sample 97-24 (R8 +++) demonstrated similar seal width behavior and porosity but darkened significantly upon irradiation by the laser 114. Sample 24 was also observed to form pores within the frit 108 where a low power laser alignment was performed in which the laser 114 had a defocused beam that had been centered using a thermal detector.

In observing the results of these sealing tests, there did not appear to be a single condition that stood out as better than the others. The wide seals (R2, R4, and R6) only had the top temperature of 350° C. in common. The narrow seals (R1, R7) only had the top temperature of 400° C. in common. As indicated above, the darkening of the frit 108 during the sealing step 216 may indicate a better seal 112.

In this experiment, several sintered 1737 Code glass plates 102 where also tested to see how well the frit 108 was attached. In particular, sample 97-23 which had the least sintering (---), sample 97-26 which had the most sintering (+++), and sample 97-30 which was sintered per the aforementioned sintering schedule shown in TABLE #2 had all been tested. These three sintering conditions resulted in three distinct microstructures: (1) the frit sample 97-23 was not sintered since the frit rubbed off with a finger with virtually no resistance; (2) the frit sample 97-30 had a microstructure that looked like the standard process for this particular frit; and (3)

the frit sample 97-26 had a microstructure that contained significantly more and larger white areas than the standard firing but it was not a solid mass of white like some of the previous over-fired/heated frit samples. The scratch testing using a nanoindenter was not successful in these last two tests since the frit 108 was too thick and too strong. As a result, a manual scratch test was performed on frit samples 97-26 and 97-30 which indicated that both frit samples seemed well-adhered where the frit sample 97-30 had a slightly better adhesion than the frit sample 97-26.

In an additional experiment, several sintered frit-Code 1737 glass plates 102 where tested to obtain the results of a Differential scanning calorimetry/thermogravitational analysis (DSC/TGA). In this particular experiment, the frit 108 had the following composition:

TABLE #13

| 895AOC Glass 3-10 um powder | | β-eucryptite 3-10 um powder | |
|---|---|---|---|
| Oxide | mol % | Oxide | mol % |
| Sb2O3 | 23.50 | LiO2 | 25.00 |
| V2O5 | 47.50 | AL2O3 | 25.00 |
| P2O5 | 27.00 | SiO2 | 50.00 |
| TiO2 | 1.00 | | |
| Al2O3 | 1.00 | | |

Figure 9:
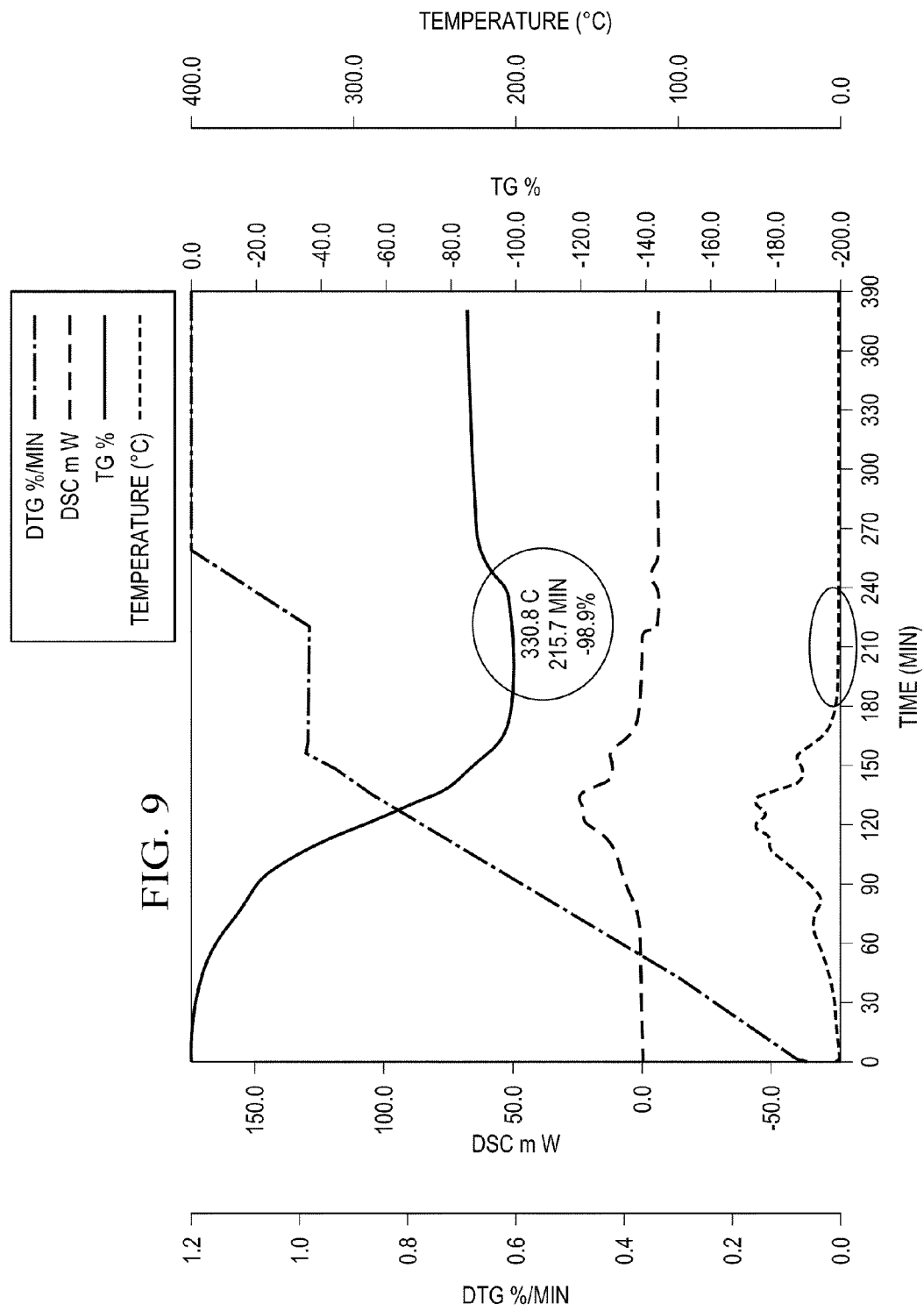

To avoid denitrification, the top temperature of 400° C. was adopted (see program "R7" in TABLE #10 also known as "R400"). The 2-hour hold time at 400° C. was kept because it seemed to do no harm and it is believed that this hold time can be shortened to about 30 minutes. The middle hold temperature of 200-250° C. was raised to 325° C. to be sure that the organics of the Texanol blend vehicle were completely volatilized since 99% of the organics are gone by 331° C. FIG. 9 shows the results of the DSC/TGA analysis that followed the R7 schedule, in air, of 20-325° C. with a ramp rate (RR) of 2° C./min and hold at 325° C. for 1 hour in air, then, in $N_2$, 15 minutes at 325° C., 325-400° C. (RR 2° C./min), and a hold at 400° C. for 2 hours. As can be seen, there was a weight increase of 1.3% after 331° C. which may have been caused by carbon ash that was left within the container. When this residue was taken from RT to 600° C. while in $N_2$ (to simulate the sealing temperature), there was a weight loss of 34% by 600° C. For a FVR of 2, there would be 0.37% of carbon residue and when this is normalized to the frit weight in a 2"×2" pattern (5.48×10$^{-3}$ μm) it equals 20 μg left in the frit 108 after the sealing step 216. Even if this was the case, the quality of the frit seals 112 would not be compromised. In FIG. 9, the organics loss is circled on the lowest curve and the higher circle indicates that there is a weight loss of 99% by 330.8° C.

These experimental sealed frits 108 also underwent 85° C./85% relative humidity (RH) testing during which it was discovered that the frit 108, in some cases, was being dissolved or leached. To address this problem, Fe was added to the frit glass and the sintering step 210 took place in $N_2$ to prevent the vanadium in the frit 108 from oxidizing. The $N_2$ was introduced into the furnace when the temperature was high enough that the organics had nearly all volatilized and higher than the glass transition temperature (Tg) of the frit 108, and then this temperature was kept on through the rest of the sintering schedule 210. These changes led to a more durable frit so that the dissolution-leaching of the frit 108 was no longer observed in the tested frits 108.

Figure 10:
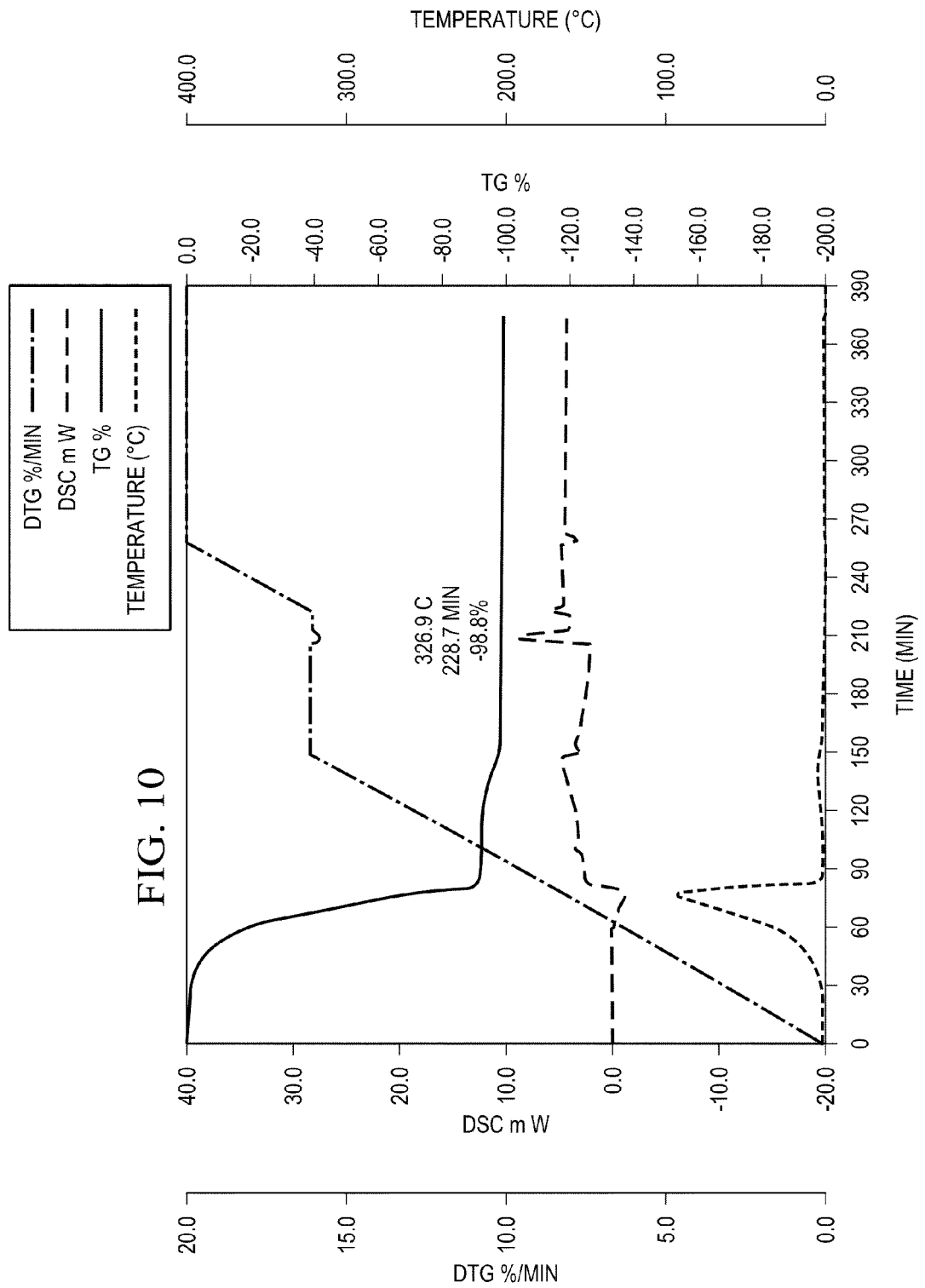

FIG. 10 shows the results of a DSC/TGA test that was performed when the frit paste 108 was sintered using the "R7" schedule which had 325° C./hold for 1 hr+15 minutes, then the $N_2$ turned on at 325° C. within the last 15 minutes of the hold, then hold at 400° C. for 2 hours. As can be seen, there was no compromise to the loss of the organics, 99% are gone by 327° C. and there was no increase in weight beyond this temperature. In this test, the main source of the $CO_2$ was likely to be the batch material iron (II) oxalate which is a blend of Fe2O3 (44%) and CO2 (49%). It is listed as "FeC2O4.2H2O".

The above-mentioned experiments including the "no-grind" second test frit 108 which was made into a paste and mixed with a Texanol-based vehicle before being dispensed by Micropen onto a glass plate 102 can be summarized as follows:

When the sintering top temperature is 450° C., the frit 108 did not seal.

The sintering schedule 210 should allow enough time for the Texanol-vehicle to volatilize at a temperature lower than the Tg of the frit's glass.

When the top sintering temperature is 350° C., the frit 108 hardly adhered to the glass plate 102. In particular, the glass of the frit 108 did not flow enough to congeal and adhere to the glass plate 102.

Pores in the sintered frit 108 may be due to a non-ideal particle packing of the powders after the vehicle had volatilized and before the flowing of the frit's glass.

At temperatures >430° C., the frit's glass devitrified, with the main phase as $(Sb_xV_x)O_4$. The sintered frit 108 also contained lithium-containing crystals ($Li_{0.04}V_2O_5$ and $Li_2SiO_3$) which means that the frit's glass was also reacting with the β-eucryptite filler. These crystals neither melt nor flow so they prevent the heat of the laser beam 116 from be transferred to the frit 108, thereby forming a poor seal.

When the top temperature is 400° C., the frit 108 sealed well to the glass plate 102 regardless of whether the hold time was 0.5 or 2 hours. Basically, the experiments with the exemplary tested frit 108 indicated that this exemplary sintering schedule 210 with 350° C. is too cold, 450° C. is too hot, and 400° C. (±15° C.) was fine.

Although multiple embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

The invention claimed is:

1. A sealed glass package comprising:
a first glass plate; and
a second glass plate, wherein the first glass plate and the second glass plate are connected to one another by a transition metal-lanthanide doped glass frit which formed a seal between the first glass plate and the second glass plate, wherein the transition metal-lanthanide doped glass frit has a predetermined color due to a sintering process which was performed in less than 8 hours and in a reducing atmosphere to attach the transition metal-lanthanide doped glass frit to the first glass plate before the second glass plate was placed on the sintered transition metal-lanthanide doped glass frit and the sintered transition metal-lanthanide doped glass frit was melted to form the seal between the first glass plate and the second glass plate.

2. The sealed glass package of claim 1, wherein said transition metal-lanthanide doped glass frit which forms the seal has a brown color.

3. The sealed glass package of claim 1, wherein said sealed glass package comprises an organic light emitting diode device.

4. The sealed glass package of claim 1, wherein the transition metal is selected from the group consisting of iron, copper and vanadium.

5. The sealed glass package of claim 4, wherein the transition metal comprises $V^{+3}$.

* * * * *